United States Patent
Berthold

(10) Patent No.: US 6,570,439 B2
(45) Date of Patent: May 27, 2003

(54) CIRCUIT ARRANGEMENT TO REDUCE THE SUPPLY VOLTAGE OF A CIRCUIT PART AND PROCESS FOR ACTIVATING A CIRCUIT PART

(75) Inventor: Joerg Berthold, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/132,502

(22) Filed: Apr. 25, 2002

(65) Prior Publication Data

US 2002/0158683 A1 Oct. 31, 2002

(30) Foreign Application Priority Data

Apr. 27, 2001 (DE) .......................................... 101 20 790

(51) Int. Cl.$^7$ ................................................. G05F 1/10
(52) U.S. Cl. ..................................................... 327/544
(58) Field of Search ................................. 327/530, 534, 327/535, 544, 564, 565

(56) References Cited

U.S. PATENT DOCUMENTS 5,781,062 A * 7/1998 Mashiko et al. ............. 327/544
6,031,778 A * 2/2000 Makino et al. .............. 365/226
6,049,245 A * 4/2000 Son et al. .................... 327/544
6,107,869 A * 8/2000 Horiguchi et al. ........... 327/544

FOREIGN PATENT DOCUMENTS

DE    198 11 353 C1    3/1998

* cited by examiner

Primary Examiner—Jeffrey Zweizig
(74) Attorney, Agent, or Firm—Workman Nydegger Seeley

(57) ABSTRACT

In order to achieve reliable operation despite the greater interference susceptibility of a circuit (1) at a reduced power supply, in addition to a global power supply path (6, 7) to supply the circuit (1) in operating state, a rest state power supply path (10, 11) is provided with which the circuit (1) is connected in particular via transistor diodes (14, 15). As soon as the circuit (1) by way of first switches (12, 13) is separated from the global power supply path (6, 7), because of the voltage loss in the transistor diodes (14, 15) it is supplied by the rest state power supply path (10, 11) which is provided exclusively to supply circuit parts (1) set into rest state and on which therefore fewer current or voltage peaks can occur.

12 Claims, 4 Drawing Sheets

FIG 1  State of the Art

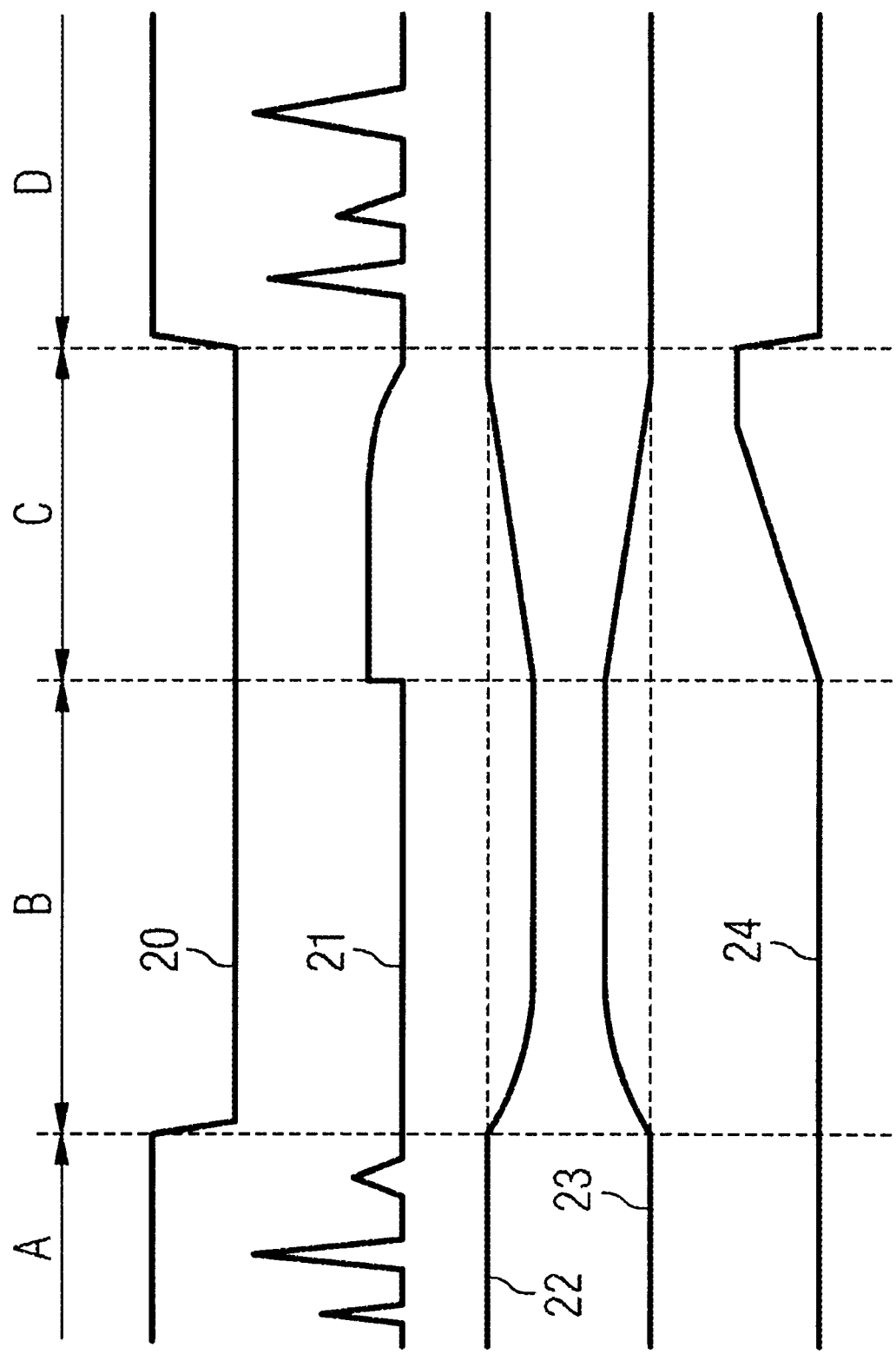

CIRCUIT ARRANGEMENT TO REDUCE THE SUPPLY VOLTAGE OF A CIRCUIT PART AND PROCESS FOR ACTIVATING A CIRCUIT PART

CROSS-REFERENCE TO RELATED APPLICATIONS

This application claims priority to German Patent Application No. DE 101 20 790.5, filed Apr. 27, 2001 which is incorporated herein by specific reference.

BACKGROUND OF THE INVENTION

1. The Field of the Invention

The invention concerns a circuit arrangement to reduce the supply voltage of a circuit part and a process for activating a circuit part supplied with reduced voltage.

2. The Relevant Technology

In electronic circuits the aim is to reduce the power or current consumption. This is the case in particular in modern CMOS circuits in which a high switching speed is offset by a high rest current. Furthermore as a rule a reduced current consumption is required in network-independent, battery- or accumulator-supplied circuits. For this it is known to place unused circuit parts in rest state with reduced voltage supply and hence reduced current consumption.

If a circuit part however has storage cells, their stored data must not be lost. Even in rest state the counter consumption must not fall to zero else the memory content will be lost. In such cases for example it is known from DE 198 11 353 C1 to reduce the supply voltage of the circuit part in rest state in order to achieve a lower current consumption and retain the memory content. For this the local power supply path of the circuit part which can be set into rest state is connected with a global power supply path with switching transistors for low impedance connection of the two power supply paths, to each of which is connected in parallel a transistor diode. As soon as the switching transistors are switched off, the supply current for the circuit part flows through the transistor diodes at which, however, a certain voltage is lost so that the supply voltage of the circuit part and hence its current consumption is reduced.

This solution has in particular the disadvantage that the voltage in the global power supply path fluctuates because of switching processes in other circuit parts and hence can influence the voltage in the local power supply path of the circuit part. This can in particular mean the loss of memory content as at reduced supply voltage in rest state the memory cells have a lower protection against interference. Furthermore disadvantageously in this circuit arrangement there is an increased risk of data loss also during the reactivation process.

If namely at the start of the reactivation process the two switching transistors are closed, the circuit part with the memory cells must be charged to the amount of the voltage in the global power supply path so that a relatively high current flows which at the start of the reactivation process can lead to data loss because of the low interference protection. Furthermore by closing the switching transistors the local power supply path of the circuit part is connected low impedance with the global power supply path so that also current peaks caused by other circuit parts can also lead to data loss in this phase of reduced interference protection.

BRIEF SUMMARY OF THE INVENTION

The present invention is therefore based on the object of creating a circuit arrangement or a process of the type described initially with which a circuit part can be set into rest state and reactivated without the risk of disruptive current or voltage peaks.

According to the invention this task is solved by a circuit arrangement and a process. Advantageous refinements and embodiment forms of the present invention are also described.

The additional rest state power supply path allows essentially better operating conditions to be created for a circuit part in the rest state as the power supply path for the rest state can be designed according to the features necessary for a fault-free rest state independently of the global power supply path. For the global power supply path to supply the active circuit parts usually a low impedance connection is required in order to guarantee a constant power supply even on changing power consumption, and also to allow the supply with increased current to achieve high switch speeds. Such a low impedance design however also transfers current and voltage peaks better and thus with the arrangement known in the state of the art can disrupt circuit parts in the rest state. The additional power supply path for the rest state according to the invention however need not supply high currents and hence can be designed with high impedance so that a better decoupling is achieved from the current and voltage peaks occurring in the circuit.

With the solution according to the invention in general certain circuit parts can be decoupled from a first or the global power supply path and coupled to a second power supply path or the rest state power supply path. If now inactive circuit parts alone are coupled to the second power supply path, on this necessarily essentially fewer current and power peaks occur so that the circuit parts coupled to these are exposed to less disruption. For example these can be general circuit parts which almost must be supplied with voltage even in inactive state, where however interference via the power supply should be avoided.

If on the circuit means for connecting the global power supply path with the rest state power supply path a voltage drop occurs when current is flowing, in this way the supply voltage of circuit part in the rest state can be reduced whereby its power consumption is usually lowered. Such circuit means can for example be transistor diodes, diodes or Zener diodes with which a variable voltage drop can be set. For transistor diodes or diodes, several can be connected in series to achieve a greater voltage drop and hence a lower power supply to the circuit part. Furthermore as circuit means switching transistors can be used where however it must be ensured that the switching transistors must not be closed as at the same time as the first switching means.

Furthermore it is possible to apply a lower voltage to the rest state power supply path so that for the same voltage drop at the second switching means a lower power supply of the circuit part can be achieved. In addition in this way the efficiency of the entire circuit can be increased as the voltage difference between the global and the rest state power supply paths can be created not exclusively via a voltage drop at the circuit means but also in other ways in particular by voltage transformers.

Advantageously the circuit arrangement has second switching means for connecting the global power supply path with the rest power supply path. In this way the interference resistance during the reactivation process can be increased as a circuit part in rest state is first charged with the interference-resistant rest state power supply path by closing the second switching means and then connected with the global power supply path by closing the first switching means. Thus even at the start of the reactivation process where, because of the still low voltage, the interference resistance is less, no current or voltage peaks occurring on the global power supply path can disrupt the circuit.

As soon as the circuit part to be reactivated is adequately charged via the rest state power supply path by closing the second switching means and connected to the global power supply path by closing the first switching means, the second switching means are opened again in order to prevent a low impedance connection of the global power supply path with the rest state power supply path. Otherwise disadvantageously electrical interference from the global power supply path could reach the rest state power supply path and damage circuit parts in rest state.

Advantageously switching means MOS transistors are used as these can be triggered with low power levels and in the controlled open state have a low voltage drop. If the circuit part to be put into rest state is a MOS circuit, switching means designed as MOS transistors can advantageously be integrated on the semi-conductor of the circuit part.

BRIEF DESCRIPTION OF THE DRAWINGS

The invention will now be explained below with reference to preferred embodiments shown in the enclosed drawing.

FIG. 4 shows the temporal development of various voltages or currents within the circuit arrangement according to FIG. 3.

DETAILED DESCRIPTION OF THE PREFERRED EMBODIMENTS

Figure 1:
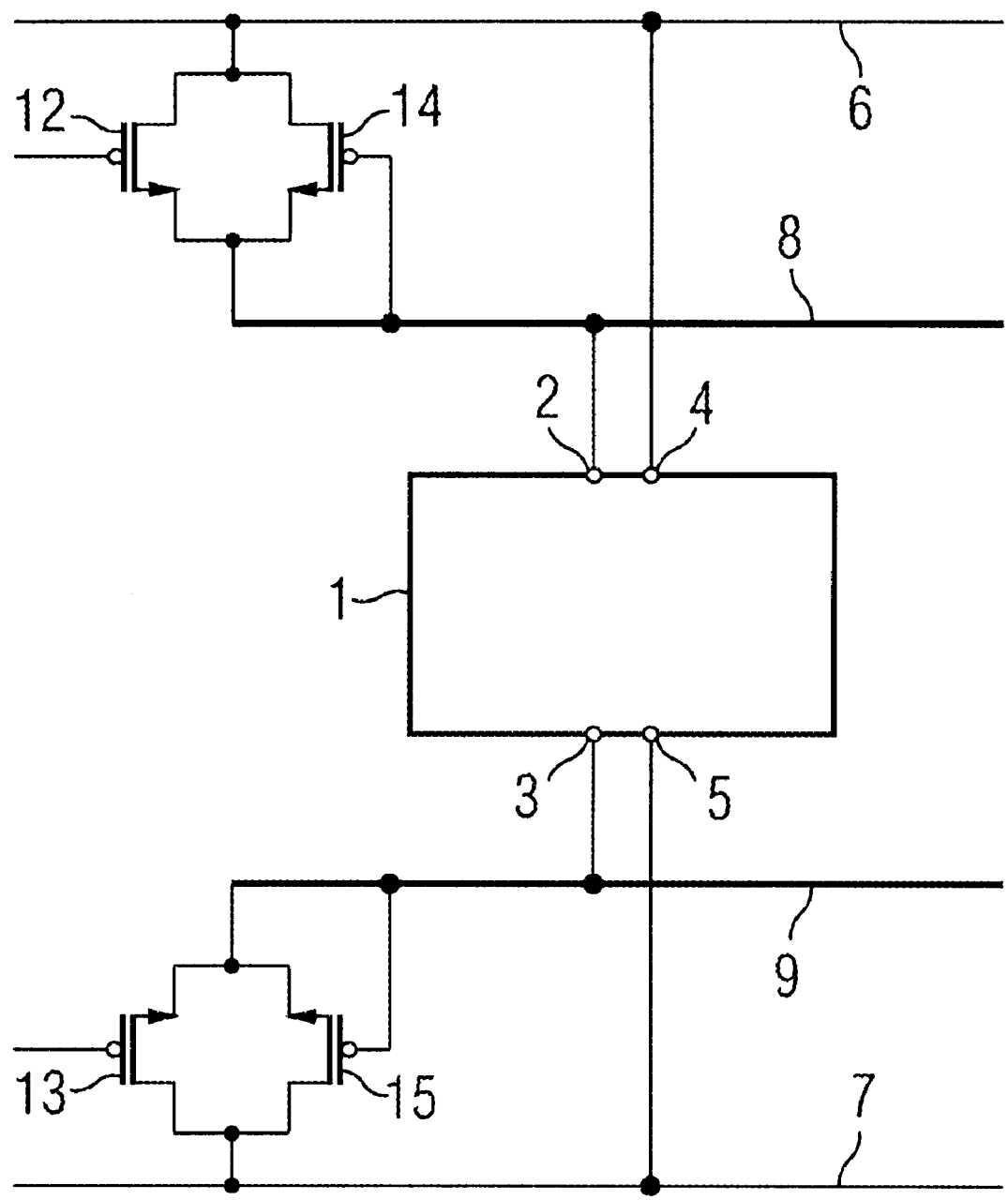
FIG. 1 shows a known circuit arrangement according to the state of the art.

The circuit arrangement shown in FIG. 1 has a circuit part 1 to be put into the rest state, which contains memory cells which must be supplied with a voltage—albeit reduced—even in rest state in order not to lose their memory contents. The circuit part 1 has a positive power supply connection 1 and a negative power supply connection 3. Furthermore the circuit part 1 has connections 4, 5 connected with the internal semi-conductor substrate via which a substrate voltage can be applied. Because of the substrate control effect this leads to higher usage voltages in the memory transistors so that for the reduced power supply in rest state, the interference protection is increased.

The power supply connections 2, 3 of the circuit part 1 are connected to the positive part 8 and negative part 9 respectively of a local power supply path.

The local voltage supply paths 8, 9 which are in direct connection with the circuit part 1 are again connected, by means of two switching transistors 12, 13 each with parallel connected transistor diodes 14, 15, with the positive part 6 and negative part 7 respectively of a global power supply path. Thus the transistor diode 14 is connected between the positive part 6 of the global power supply path 6, 7 and the positive part 8 of the local power supply path 8, 9 so that the current can flow only from positive parts 6 of the global power supply path 6, 7 to the positive path 8 of the local power supply path 8, 9. The same applies in reverse for the second transistor diode 15 between the negative parts 7, 9 of the global and local power supply paths.

In active operation the two switching transistors 12 or 13 are closed so that the circuit part 1 can be connected low impedance via the local power supply path 8, 9 with the global power supply path 6, 7. In order to put the circuit part 1 into rest state, the two switching transistors 12, 13 are opened whereby the voltage between the positive parts 6, 7 and the negative parts 7, 9 of the two power supply paths 6, 7, 8, 9 rises. When the voltage reaches an amount at which the two transistor diodes 14, 15 begin to conduct, a current flows through the circuit 1 from the global power supply path 6, 7 via the two transistor diodes 14, 15 and the local power supply path 8, 9. The voltage present at circuit 1 in rest state is equal to the voltage of the global power supply path 6, 7 less the two voltage drops at the two transistors 14, 15. Because of the lower supply voltage of the circuit 1, its current requirement is also reduced so that by this measure the current consumption can be lowered.

Figure 2:
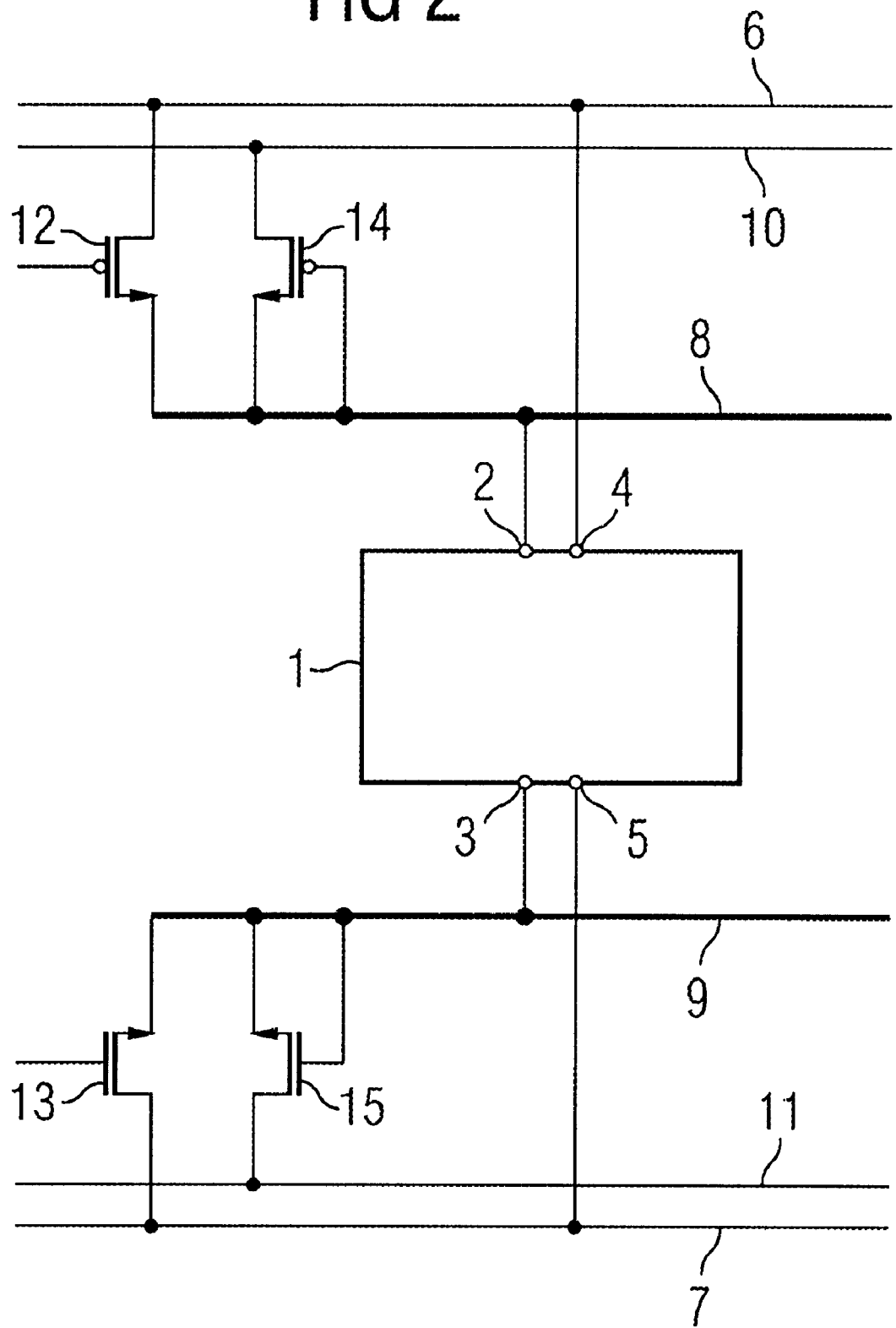
FIG. 2 shows a first embodiment of the circuit arrangement according to the invention.

FIG. 2 shows a first embodiment of the circuit arrangement according to the invention. This has in addition to the circuit arrangement shown in FIG. 1 a rest state power supply path 10, 11 which is provided exclusively to supply circuit parts set into the rest state.

Also with the embodiment described, the transistor diodes 14, 15 are each connected between the local power supply path 8, 9 and rest state power supply path 10, 11. If now the switching transistors 12, 13 are blocked in order to put a circuit part 1 into rest state, and if the voltage of the local power supply path 8, 9 falls below the value of the voltage in the rest state power supply path 10, 11 less the voltage drops in the transistor diodes 14, 15, a current begins to flow from the rest state power supply path 10, 11 via the two transistor diodes 14, 15 through the circuit part 1. By blocking the two switching transistors 12, 13 thus the circuit part 1 is completely decoupled from the global power supply path 6, 7 and via the transistor diodes 14, 15 coupled to the rest state power supply path 10, 11.

The rest state power supply path 10, 11 is connected with the global power supply path 6, 7 at a point which lies as close as possible to the input point of the supply voltage in order to be decoupled from the current or voltage peaks which under certain circumstances can be created in the global power supply path by active circuit parts. For example the global power supply path 6, 7 and the rest state power supply path 10, 11 can both be connected directly to connection points at which the supply voltage for the entire circuit is applied, whereby this remains the sole connection between the two power supply paths. Furthermore the rest state power supply path 10, 11 can be connected via a resistor and/or an inductive resistor to the common power supply in order to achieve a better decoupling from the global power supply path 6, 7.

If now the circuit part 1 is reactivated, the two switching transistors 12, 13 are closed. As in the controlled open state these have a lower voltage drop than the two transistor diodes 14, 15, the local power supply path 8, 9 is charged via the switching transistors 12, 13 to almost the voltage value of the global power supply path 6, 7. As soon as the voltage difference between the positive parts 8, 10 or between the negative parts 9, 11 of the local power supply path 8, 9 or the rest state power supply path 10, 11 becomes less than the passage voltage of the transistor diodes 14, 15, these are blocked. The circuit 1 with its local power supply path 8, 9 is thus decoupled from the rest state power supply path 10, 11 and supplied exclusively via the switching transistors 12, 13 from the global power supply path 6, 7.

Figure 3:
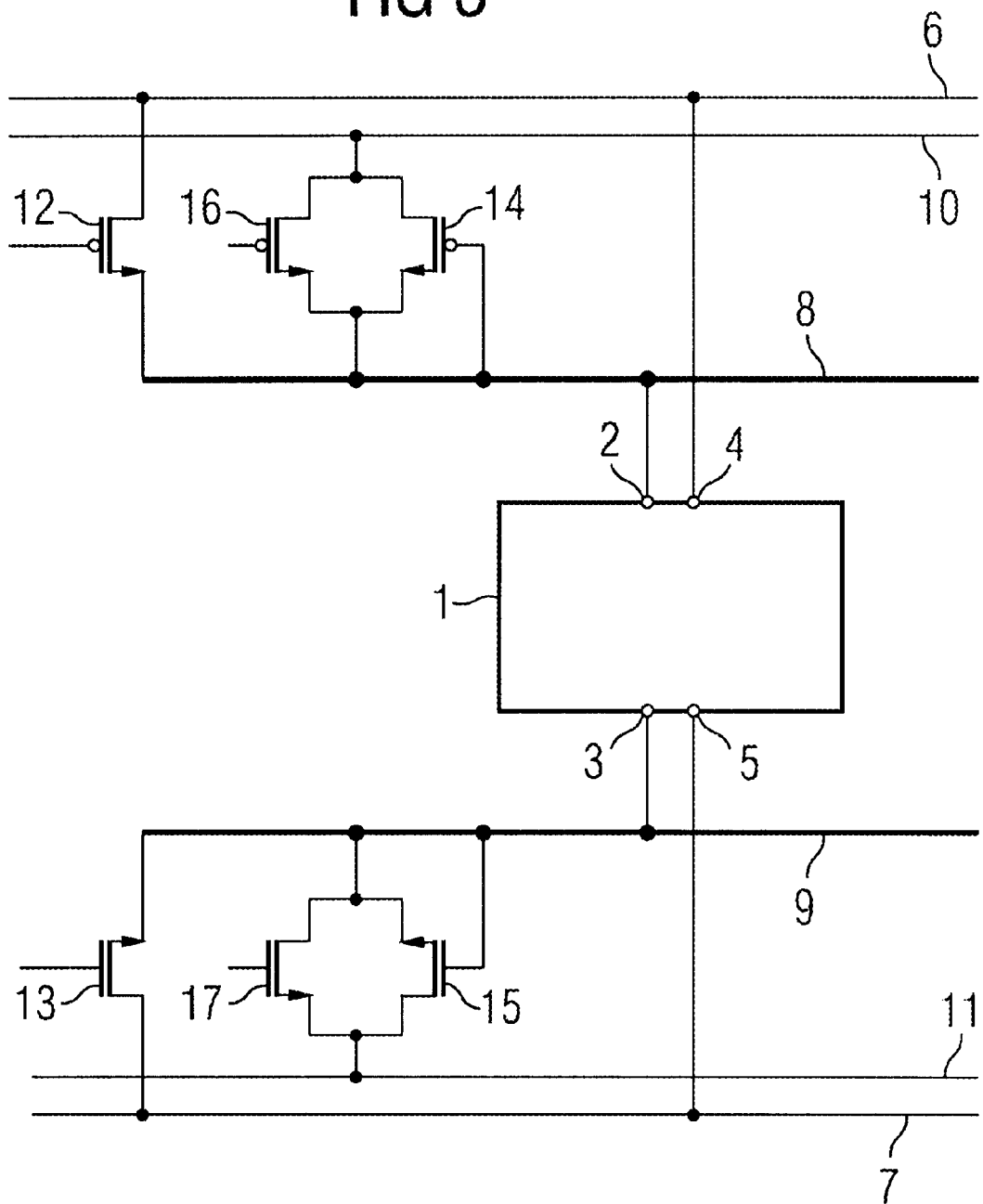
FIG. 3 shows a second embodiment of the circuit arrangement according to the invention.

FIG. 3 shows a second embodiment which corresponds essentially to the circuit arrangement shown in FIG. 2. The only difference is that connected in parallel to each of the two transistor diodes 14, 15 is a further switching transistor 16, 17. By this means, on the reactivation process, a further improvement in the interference resistance can be achieved. For this to reactivate the circuit part 1 set in the rest state, first the switching transistors 16, 17 are closed which connect the local power supply path 8, 9 low impedance with the rest state power supply path 10, 11. As the voltage drop at the two controlled open switching transistors 16, 17 is less than that of the parallel-connected transistor diodes 14, 15, the voltage in the local power supply path 8, 9 is raised almost to the value of the voltage in the rest state power supply path 10, 11. Advantageously here during the reactivation process in which right at the start the interference susceptibility is increased because of the still low supply voltage, the circuit 1 is connected with the rest state power supply path 10, 11 on which no or at least essentially lower current and voltage peaks occur.

As soon as the voltage in the local power supply path 8, 9 is raised to the value of the voltage in the rest state power supply path 10, 11 or at least to a value at which the interference protection of the circuit 1 is sufficiently low, the switching transistors 16, 17 between the local power supply path 8, 9 and the rest state power supply path 10, 11 are opened and the switching transistors 12, 13 between the local power supply path 8, 9 and the global power supply path 6, 7 closed. In this way the circuit 1 to be set into active state, in which it can cause current or voltage peaks, is again completely coupled to the global power supply path 6, 7 and decoupled from the rest state power supply path 10, 11, which according to the invention should remain reserved for the non-active circuits.

The development of the individual switch or current or voltage signals in the circuit arrangement according to the second embodiment is shown in FIG. 4. Here A and D indicate the active state, B the rest state and C the reactivation process of the circuit 1. The line 20 represents an activation signal which controls the switching transistors 12, 13 to connect the global power supply path 6, 7 and local power supply path 8, 9. The line 21 shows the current fluctuations of the current flowing through the circuit 1. The line 22 corresponds to the potential of the positive part 8 of the local power supply path 8, 9, in contrast to which the line 23 corresponds to the potential of the negative part 9 of the local power supply path 8, 9. The line 24 corresponds to a second activation signal which controls the two switching transistors 16, 17 to connect the local power supply path 8, 9 and the rest state power supply path 10, 11.

In the active phases of the circuits 1 A, D, the two switching transistors 12, 13 (line 20) are triggered and the two switching transistors 16, 17 (line 24) are not triggered or opened so that the circuit 1 is supplied exclusively by the global power supply path 6, 7. As it is clear from lines 22 and 23, in this phase at circuit 1 a high operating voltage is present which essentially corresponds to the voltage of the global power supply path 6, 7. As line 21 shows, the circuit 21 in this operating state is however also exposed to the current peaks occurring in the global power supply path 6, 7.

In rest state B the two switching transistors 12, 13 (line 20) are no longer triggered or opened whereby the switching transistors 16, 17 (line 24) remain opened so that the voltage on circuit 1 (lines 22 and 23) falls to a lower level after a certain discharge time. This voltage corresponds to the voltage at the rest state power supply path 10, 11 less the voltage drops in the two transistor diodes 14, 15 via which in this phase only the current flows to supply circuit 1.

In the reactivation phase C the two switching transistors 16, 17 (line 24) are closed whereas the two switching transistors 12, 13 (line 20) remain open so that the voltage in the local power supply path 8, 9 is slowly raised to the value of the voltage in the rest state power supply path 10, 11. In this phase a small current jump (line 21) occurs only at the start when the two switching transistors 16, 17 (line 24) are triggered, without however the circuit 1 being exposed to the essentially higher current peaks occurring in the active phases A, D.

At the end of the reactivation process C the two switching transistors 16, 17 (line 24) are opened and the two switching transistors 12, 13 (line 20) closed so that the circuit 1 is again coupled low impedance to the global power supply path 6, 7. In this state the circuit 1 is again exposed to the current peaks (line 21) occurring in the global power supply path 6, 7 where however it is now operated with the voltage of the global power supply path 6, 7 so that the current peaks cannot disrupt its operation.

What is claimed is:

1. Circuit arrangement to reduce the supply voltage of a circuit part (1) with a global power supply path (6, 7), a local power supply path (8, 9) connected with the circuit part (1) and first switching means (12, 13) for connecting the global power supply path (6, 7) with the local power supply path (8, 9), wherein the circuit arrangement has a rest state power supply path (10, 11) and switching means (14, 15) by way of which the local power supply path (8, 9) can be connected with the rest state power supply path (10, 11).

2. Circuit arrangement according to claim 1, wherein an essentially constant voltage falls at the switching means (14, 15) when current flows.

3. Circuit arrangement according to claim 1, wherein the switching means (14, 15) comprises switching transistors.

4. Circuit arrangement according to claim 1, wherein the switching means (14, 15) only have one current passage direction and comprise transistor diodes.

5. Circuit arrangement according to claim 1, wherein the rest state power supply path (10, 11) has a higher internal resistance than the global power supply path (6, 7).

6. Circuit arrangement according to claim 1, wherein the rest state power supply path (10, 11) has a lower voltage than the global power supply path (6, 7).

7. Circuit arrangement according to claim 4, wherein the circuit arrangement has second switching means (16, 17) for connecting the local power supply path (8, 9) with the rest state power supply path (10, 11).

8. Circuit arrangement according to claim 1, wherein the switching means (12, 13, 16, 17) comprises MOS transistors.

9. Circuit arrangement according to claim 1, wherein the circuit part (1) comprises a memory module.

10. Circuit arrangement according to claim 1, wherein the circuit part (1) has MOS elements, on the substrate of which is applied, as a substrate voltage, the voltage present on the global power supply path (6, 7).

11. Process for activation of a circuit part (1) supplied with reduced voltage in a circuit arrangement according to claim 7, wherein first for a particular period the local power supply path (8, 9) is connected via the second switching means (16, 17) with the rest state power supply path (10, 11) and then the local power supply path (8, 9) connected via the first switching means (12, 13) with the global power supply path (6, 7).

12. Process according to claim 11, wherein the second switching means (16, 17) are controlled continuously rising during the first time period.

* * * * *